(12) United States Patent
Lee et al.

(10) Patent No.: US 11,634,441 B2
(45) Date of Patent: Apr. 25, 2023

(54) GROUP 5 METAL COMPOUND FOR THIN FILM DEPOSITION AND METHOD OF FORMING GROUP 5 METAL-CONTAINING THIN FILM USING SAME

(71) Applicant: EGTM Co., Ltd., Gyeonggi-do (KR)

(72) Inventors: Tae Young Lee, Gyeonggi-do (KR); Sung Jun Ji, Gyeonggi-do (KR); Sun Young Baik, Incheon (KR)

(73) Assignee: EGTM Co., Ltd., Suwon-Si (KR)

( * ) Notice: Subject to any disclaimer, the term of this patent is extended or adjusted under 35 U.S.C. 154(b) by 0 days.

(21) Appl. No.: 17/343,212

(22) Filed: Jun. 9, 2021

(65) Prior Publication Data

US 2021/0403492 A1    Dec. 30, 2021

(30) Foreign Application Priority Data

Jun. 30, 2020    (KR) .................. 10-2020-0080284

(51) Int. Cl.
 *C07F 9/00* (2006.01)
 *C23C 16/18* (2006.01)
 *C23C 16/455* (2006.01)

(52) U.S. Cl.
 CPC ............... *C07F 9/00* (2013.01); *C23C 16/18* (2013.01); *C23C 16/45527* (2013.01)

(58) Field of Classification Search
 None
 See application file for complete search history.

(56) References Cited

FOREIGN PATENT DOCUMENTS

EM    2573096 A1    3/2013
JP    2010507729 A    3/2010
(Continued)

OTHER PUBLICATIONS

Gibson et al, Dalton Trans., 2003, 4457-4465.*
(Continued)

*Primary Examiner* — Clinton A Brooks

(57) ABSTRACT

A group 5 metal compound according to an embodiment of the present disclosure is represented by any one of the following <Chemical Formula 1> and <Chemical Formula 2>:

In <Chemical Formula 1> and <Chemical Formula 2>, M is any one selected from group 5 metal elements, (Continued)

n is any one selected from an integer of 1 to 5, $R_1$ is any one selected from a linear alkyl group having 3 to 6 carbon atoms and a branched alkyl group having 3 to 6 carbon atoms, and $R_2$ and $R_3$ are each independently any one selected from hydrogen, a linear alkyl group having 1 to 4 carbon atoms, and a branched alkyl group having 1 to 4 carbon atoms.

2 Claims, 2 Drawing Sheets

(56) References Cited

FOREIGN PATENT DOCUMENTS

| KR | 100700632 B1 | 3/2007 |
|---|---|---|
| KR | 2010-0060481 A | 6/2010 |
| KR | 20110081181 A | 7/2011 |
| KR | 20130049020 A | 5/2013 |
| KR | 2015-0143371 A | 12/2015 |
| KR | 20200008048 A | 1/2020 |
| TW | 201934563 A | 9/2019 |
| WO | WO-2010040741 A1 | 4/2010 |

OTHER PUBLICATIONS

"Vanadium NMR of organovanadium complexes", D. Rehder / Coordination Chemistry Reviews 252 (2008).
Office Action dated Jun. 14, 2022 from Japanese Patent Office for Japanese Patent Application No. 2021-106782.
Translation of Office Action dated Jun. 14, 2022 corresponding to Japanese Patent Application No. 2021-106782.
Office Action dated Jul. 6, 2022 from Korean Patent Office for Korean Patent Application No. 10-2020-0080284.
Translation of Office Action dated Jul. 6, 2022 from Korean Patent Office for Korean Patent Application No. 10-2020-0080284.
Gibson et al. Synthesis, X-Ray Structure and Reactivity ofthe Half-Sandwich IMIDO Complex , Polyhedron. 1989, vol. 8, Issues 13-14, pp. 1819-1820.
Translation of Decision to Grant a Patent dated Dec. 14, 2022 from Japanese Patent Office for Japanese Patent Application No. 2021-106782.
Decision to Grant a Patent dated Dec. 14, 2022 from Japanese Patent Office for Japanese Patent Application No. 2021-106782.

* cited by examiner

|  | COMPARATIVE EXAMPLE | EXAMPLE 1 | EXAMPLE 2 |
|---|---|---|---|
| $T_d$(°C) | 285.59°C | 336.11°C | 328.91°C |

FIG. 1

GROUP 5 METAL COMPOUND FOR THIN FILM DEPOSITION AND METHOD OF FORMING GROUP 5 METAL-CONTAINING THIN FILM USING SAME

CROSS-REFERENCE TO RELATED APPLICATIONS

This application claims the priority of Korean Patent Application No. 10-2020-0080284 filed on Jun. 30, 2020, in the Korean Intellectual Property Office, the disclosure of which is incorporated herein by reference.

BACKGROUND

Field

The present disclosure relates to a group 5 metal compound and a method of forming a metal thin film using the same, and more particularly, to a group 5 metal precursor compound used as a precursor and a method of forming a group 5 metal-containing thin film using the same.

Description of the Related Art

As electronic technology develops, demands for miniaturization and weight lightening of electronic elements used in various electronic devices are increasing rapidly. In order to form fine electronic elements, various physical and chemical vapor deposition methods have been proposed, and various studies for manufacturing various electronic elements such as a metal thin film, a metal oxide thin film, and a metal nitride thin film such deposition methods have been in progress.

In the manufacture of semiconductor elements, a group 5 metal compound-containing thin film is generally formed using a metal organic chemical vapor deposition (MOCVD) or atomic layer deposition (ALD) process.

However, compared to the MOCVD process, since the ALD process performs a self-limiting reaction, it has excellent step coverage, and since the ALD process is a relatively low temperature process, it can avoid deterioration of element characteristics due to thermal diffusion.

A thin film of zirconium oxide ($ZrO_2$) among group 5 metal compound-containing thin films has been used as a high-k material for an insulating layer in a capacitor structure. Recently, a niobium oxide ($Nb_2O_5$) thin film interposed between two $ZrO_2$ dielectric layers has been found to significantly reduce the leakage current and help stabilize the cubic system/tetragonal system phase of $ZrO_2$. The resulting $ZrO_2/Nb_2O_5/ZrO_2$ laminate provides higher k values in current metal-insulator-metal (MIM) capacitors of dynamic random access memory (DRAM) (Document [Alumina, J. Vac. Sci. Technol A 4 (6), 1986 and Microelectronic Engineering 86 (2009) 1789-1795]).

It is very important to select a precursor compound suitable for the deposition process in order to deposit a thin film containing niobium (Nb). Representative organometallic precursor compounds capable of forming a group 5 metal-containing thin film have been known to include pentakis(dimethylamido)tantalum (PDMAT), (tert-butyl-imido)tris(diethylamido)tantalum (TBTDET), (tert-butyl-imido)tris(diethylamido)niobium (TBTDEN), etc. However, as it is difficult to supply it by sublimating PDMAT constantly since PDMAT is a solid, a direct liquid injection (DLI) device or the like which vaporizes liquid by containing liquid in a cylindrical container, or vaporizes liquid injected at a constant flow rate has been widely used in the semiconductor element manufacturing process. In addition, as PDMAT, TBTDET, TBTDEN, and the like all have poor thermal stability, it is disadvantageous to use them at high temperatures. Accordingly, it is difficult to use the compounds in an atomic layer deposition (ALD) process for forming an oxide film having a uniform thickness on the uneven surface at 300° C.

Therefore, a precursor compound suitable for use in the atomic layer deposition (ALD) process should have a high vapor pressure at low temperatures, should be sufficiently thermally stable, and should be a liquid compound with low viscosity so that it can be easily transferred to the reaction chamber without being decomposed.

RELATED ART DOCUMENT

[Patent Document]
(Patent Document 1) Korean Laid-Open. Patent Publication No. 2020-0008048 (2020 Jan. 22.)

SUMMARY

It is an object of the present disclosure to provide a group 5 metal compound which is a liquid at room temperature, has high volatility, and is thermally stable by solving shortcomings of conventionally used metal precursor compounds, and a precursor composition for thin film deposition including the same. Furthermore, it is an object of the present disclosure to provide a thin film forming method for depositing a high-quality thin film using the precursor composition for thin film deposition including the group 5 metal compound.

Other objects of the present disclosure will become more apparent from the following detailed description.

A group 5 metal compound according to an embodiment of the present disclosure may be represented by any one of the following Chemical Formulas 1 and 2:

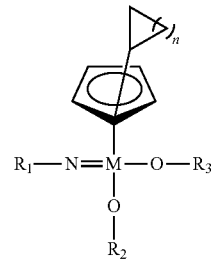

<Chemical Formula 1>

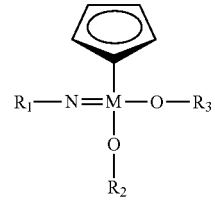

<Chemical Formula 2>

In <Chemical Formula 1> and <Chemical Formula 2>, M is any one selected from group 5 metal elements (vanadium (V), niobium (Nb), and tantalum (Ta)), n is any one selected from an integer of 1 to 5, and $R_1$ is any one selected from a linear alkyl group having 3 to 6 carbon atoms and a branched alkyl group having 3 to 6 carbon atoms. For example, $R_1$ may be any one selected from the group consisting of an n-propyl group, an iso-propyl group, an n-butyl group, a tert-butyl group, an iso-butyl group, a sec-butyl group, an n-pentyl group, a tert-pentyl group, an iso-pentyl group, a sec-pentyl group, a neopentyl group, and a 3-pentyl group. $R_2$ and $R_3$ are each independently any one selected from hydrogen, a linear alkyl group having 1 to 4 carbon atoms, and a branched alkyl group having 1 to 4 carbon atoms. For example, $R_2$ and $R_3$ may be each independently any one selected from the group consisting of hydrogen, a methyl group, an ethyl group, an n-propyl group, an iso-propyl group, an n-butyl group, a sec-butyl group, an iso-butyl group, and a tert-butyl group, and $R_2$ and $R_3$ may have the same structure as each other.

A method of forming a group 5 metal-containing thin film according to an embodiment of the present disclosure includes depositing a thin film on a substrate through a metal organic chemical vapor deposition (MOCVD) process or an atomic layer deposition (ALD) process using a group 5 metal compound represented by any one of Chemical Formula 1 and Chemical Formula 2 as a precursor.

When comparing a group 5 metal compound according to an embodiment of the present disclosure with (t-butylimido) tris(diethylamino)niobium(V) (TBTDEN) that is a representative niobium precursor, the group 5 metal compound may supply more electrons to the metal by having the advantage of cyclopentadiene (CP) structure. Due to the stable structure, the thermal stability of the compound is increased, the amount of residue is effectively reduced in the deposition process through a heteroleptic ligand structure (Metal-Alkoxide, Metal-amine, Metal-alkyl) in the metal-amine structure that is an existing homoleptic ligand, and since it is advantageous to apply the compound to the process as a liquid with high volatility, it is possible to stably deposit a single atomic layer in the atomic layer deposition (ALD) process, and the window range of the ALD process may be expanded.

Due to the above effects of the present disclosure, when a thin film is deposited on the substrate using a composition containing a group 5 metal compound, the quality of the thin film deposited on the substrate may be improved.

BRIEF DESCRIPTION OF THE DRAWINGS

The above and other aspects, features and other advantages of the present disclosure will be more clearly understood from the following detailed description taken in conjunction with the accompanying drawings, in which:

FIG. 1 is a table showing calorie (differential scanning calorimetry) analysis results of (($\eta$-$C_5H_5$)$C_5H_9$) (tBuN)Nb (OiPr)$_2$ according to Example 1, ($\eta$-$C_5H_5$) (tBuN)Nb(OiPr)$_2$ according to Example 2, and TBTDEN according to Comparative Example.

DETAILED DESCRIPTION OF THE EMBODIMENT

Figure 2:
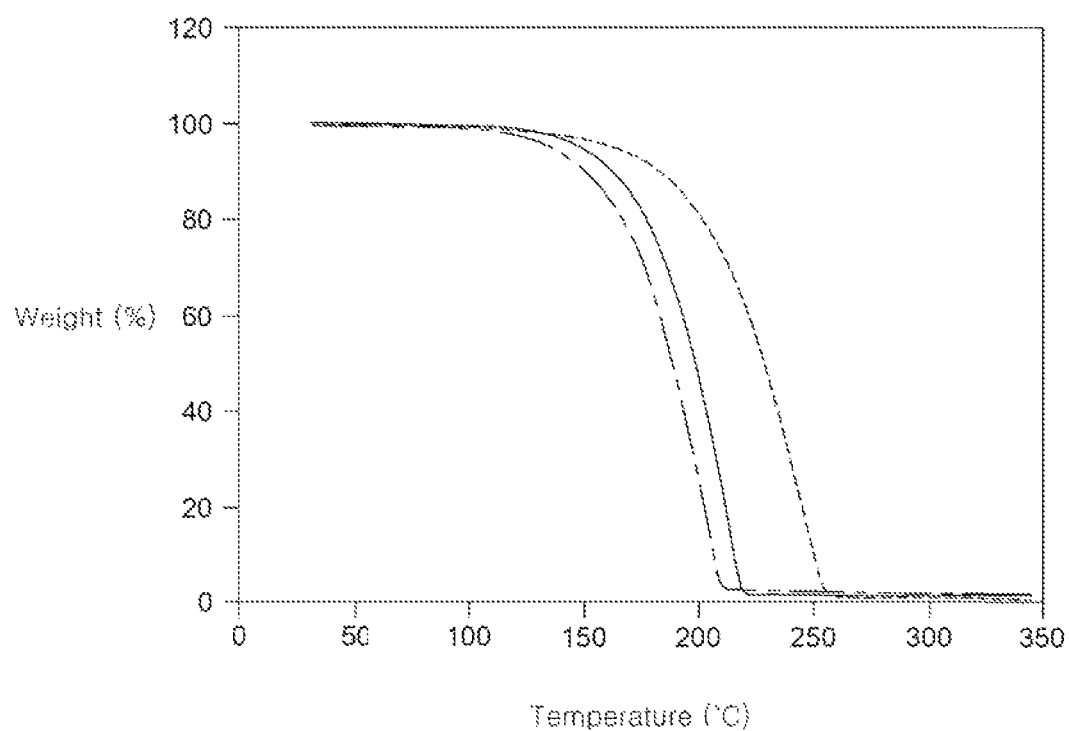
FIG. 2 is a graph showing thermogravimetric analysis (TGA) results of (($\eta$-$C_5H_5$)$C_5H_9$)(tBuN)Nb(OiPr)$_2$ according to Example 1, ($\eta$-$C_5H_5$) (tBuN)Nb(OiPr)$_2$ according to Example 2, and TBTDEN according to Comparative Example.

Hereinafter, preferred embodiments of the present disclosure will be described in more detail with reference to FIGS. 1 and 2. Embodiments of the present disclosure may be modified in various forms, and the scope of the present disclosure should not be construed as being limited to the embodiments described below. The present embodiments are provided to explain the present disclosure in more detail to a person having ordinary skill in the art to which the present disclosure pertains. Therefore, the shape of each element shown in the drawings may be exaggerated to emphasize a clearer explanation.

In the entire specification of the present disclosure, the term "alkyl" or "an alkyl group" includes a linear or branched alkyl group having 1 to 12 carbon atoms, 1 to 10 carbon atoms, 1 to 8 carbon atoms, 1 to 5 carbon atoms, 1 to 3 carbon atoms, 3 to 8 carbon atoms, or 3 to 5 carbon atoms. For example, although the alkyl group may be selected from the group consisting of a methyl group, an ethyl group, an n-propyl group ($^n$Pr), an iso-propyl group ($^i$Pr), an n-butyl group ($^n$Bu), a tert-butyl group ($^t$Bu), an iso-butyl group ($^i$Bu), a sec-butyl group ($^s$Bu), an n-pentyl group, a tert-pentyl group, an iso-pentyl group, a sec-pentyl group, a neopentyl group, a 3-pentyl group, a hexyl group, an isohexyl group, a heptyl group, a 4,4-dimethylpentyl group, an octyl group, a 2,2,4-trimethylpentyl group, a nonyl group, a decyl group, an undecyl group, a dodecyl group, and isomers thereof, it is not limited thereto.

A group 5 metal compound according to an embodiment of the present disclosure may be represented by any one of the following Chemical Formula 1 and Chemical Formula 2:

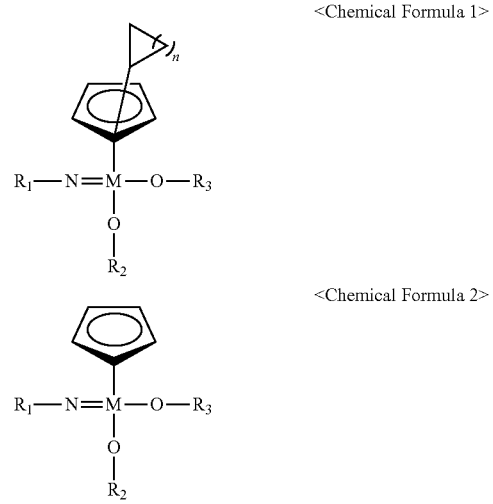

<Chemical Formula 1>

<Chemical Formula 2>

In <Chemical Formula 1> and <Chemical Formula 2>, M is any one selected from group 5 metal elements, n is any one selected from an integer of 1 to 5, $R_1$ is any one selected from a linear alkyl group having 3 to 6 carbon atoms and a branched alkyl group having 3 to 6 carbon atoms, and $R_2$ and $R_3$ are each independently any one selected from hydrogen, a linear alkyl group having 1 to 4 carbon atoms, and a branched alkyl group having 1 to 4 carbon atoms.

More specifically, M may be any one selected from the group consisting of vanadium (V), niobium (Nb), and tantalum (Ta). In addition, $R_1$ may be any one selected from the group consisting of an n-propyl group, an iso-propyl group, an n-butyl group, a tert-butyl group, an iso-butyl group, a sec-butyl group, an n-pentyl group, a tert-pentyl group, an iso-pentyl group, a sec-pentyl group, a neopentyl group, and a 3-pentyl group. Moreover, $R_2$ and $R_3$ may be each independently any one selected from the group consisting of hydrogen, a methyl group, an ethyl group, an n-propyl group, an iso-propyl group, an n-butyl group, a sec-butyl group, an iso-butyl group, and a tert-butyl group, and $R_2$ and $R_3$ may have the same structure.

More specifically, the group 5 metal compound represented by Chemical Formula 1 may be a group 5 metal compound represented by the following Chemical Formula 3:

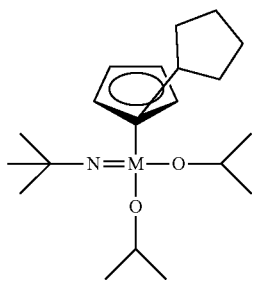

<Chemical Formula 3>

In Chemical Formula 3, M is any one selected from group 5 metal elements, and is the same as described in Chemical Formula 1.

In addition, the group 5 metal compound represented by Chemical Formula 2 may be a group 5 metal compound represented by the following Chemical Formula 4:

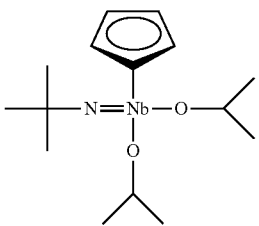

<Chemical Formula 4>

A group 5 metal compound according to an embodiment of the present disclosure has a structure in which a group 5 metal and cyclopentadiene are directly connected. A group 5 metal compound according to an embodiment of the present disclosure has excellent thermal stability since the group 5 metal compound can maintain a more structurally stable state by enabling electrons to be more easily supplied to the metal from cyclopentadiene. Accordingly, when forming a thin film using a group 5 metal compound according to an embodiment of the present disclosure, it is possible to reduce the amount of residue generated in the deposition process. In addition, since it is easy to apply the group 5 metal compound to a liquid process, it may be used in the atomic layer deposition (ALD) process.

Furthermore, in a group 5 metal compound according to an embodiment of the present disclosure, a group 5 metal forms a double bond with one nitrogen atom, and forms a single bond with two oxygen atoms respectively. A bonding energy between a group 5 metal, e.g., niobium (Nb) and an oxygen atom (O) is greater than that between niobium (Nb) and a nitrogen atom (N). Therefore, compared with a compound in which a group 5 metal and three nitrogen atoms are connected by allowing the group 5 metal to form a double bond with one nitrogen atom and form a single bond with each of two nitrogen atoms, a group 5 metal compound according to an embodiment of the present disclosure has more excellent thermal stability.

Hereinafter, a group 5 metal compound according to the present disclosure will be described in more detail through the following examples. However, this is only presented to help to understand the present disclosure, and the present disclosure is not limited to the following examples.

Example 1: Preparation of ((η-$C_5H_5$)$C_5H_9$) (tBuN) Nb(OiPr)$_2$

After injecting 20 g (0.0453 mol, 1 equivalent) of bis (diethylamido) (tert-butylimido) (cyclopentylcyclopentadiene)niobium ((η-$C_5H_5$)$C_5H_9$) (tBuN)Nb(NEt$_2$)$_2$ and 150 mL of hexane (n-hexane) into a flame-dried 500 mL Schlenk flask, the injected materials were stirred at room temperature. After adding dropwise 5.99 g (0.0997 mol, 2.2 equivalents) of isopropyl alcohol ($C_3H_7OH$) to the flask at −20° C. or lower, a reaction solution was stirred at room temperature for 12 hours. 18.73 g (yield 98%) of a light-yellow liquid compound represented by ((η-$C_5H_5$)$C_5H_9$) (tBuN)Nb (OiPr)$_2$ was obtained by removing a solvent from the reaction solution under reduced pressure and distilling the solvent-removed reaction solution under reduced pressure.

Example 2: Preparation of (η-$C_5H_5$) (tBuN)Nb(OiPr)$_2$

After injecting 11 g (0.029 mol, 1 equivalent) of bis (diethylamido) (tert-butylimido) (cyclopentadiene)niobium ((η-$C_5H_5$) (tBuN)Nb(NEt$_2$)$_2$ and 150 mL of hexane (n-hexane) into a flame-dried 500 mL Schlenk flask, the injected materials were stirred at room temperature. After adding dropwise 3.8 g (0.063 mol, 2.2 equivalents) of isopropyl alcohol ($C_3H_7OH$) to the flask at −20° C. or lower, a reaction solution was stirred at room temperature for 12 hours. 9 g (yield 90%) of a light-yellow liquid compound represented by ((η-$C_5H_5$) (tBuN)Nb(OiPr)$_2$ was obtained by removing a solvent from the reaction solution under reduced pressure and distilling the solvent-removed reaction solution under reduced pressure.

Experimental Example: Thermal Analysis

In order to find out thermal properties of (t-butylimido) tris(diethylamino)niobium(V)) (TBTDEN) according to Comparative Example, ((η-$C_5H_5$)$C_5H_9$)(tBuN)Nb(OiPr)$_2$ according to Example 1, and (η-$C_5H_5$) (tBuN)Nb(OiPr)$_2$ according to Example 2 under similar conditions, differential scanning calorimetry (DSC) analysis and thermogravimetric analysis (TGA) were performed. A thermogravimetric device was stored in a nitrogen glove box in which the moisture and oxygen contents were kept below 1 ppm. The thermogravimetric analysis was performed by putting 15 mg of a sample into a crucible. Thereafter, the sample was heated from 35° C. to 350° C. with a 10° C./min temperature gradient. The mass loss was monitored as a function of crucible temperature. The decomposition temperatures (Td) of Comparative Example, Example 1, and Example 2 according to the DSC analysis are shown in FIG. 1. In addition, the graph results according to the TGA are shown in FIG. 2. Referring to FIG. 1 and FIG. 2, it can be confirmed that ((η-$C_5H_5$)$C_5H_9$)(tBuN)Nb(OiPr)$_2$ prepared according to Example 1 and (η-$C_5H_5$) (tBuN)Nb(OiPr)$_2$ prepared according to Example 2 are more thermally stable than TBTDEN prepared according to Comparative Example. It can be seen from this that ((η-$C_5H_5$) ($C_5H_9$) (tBuN)Nb(OiPr)$_2$ according to Example 1 and (η-C$_5$H$_5$) (tBuN)Nb(OiPr)$_2$ according to Example 2 are more effectively used as vapor phase precursors.

Hereinafter, a method of forming a group 5 metal-containing thin film according to an embodiment of the present disclosure will be described.

A method of forming a group 5 metal-containing thin film according to an embodiment of the present disclosure deposits a thin film on a substrate through a deposition process using a group 5 metal compound according to an embodiment of the present disclosure as a precursor.

The deposition process may be included of an atomic layer deposition (ALD) process or a chemical vapor deposition (CVD) process, for example, a metal organic chemical vapor deposition (MOCVD) process. The deposition process may be carried out at 50 to 700° C.

First, a group 5 metal compound represented by any one of Chemical Formula 1 and Chemical Formula 2 is transferred onto a substrate. For example, although the group 5 metal compound may be supplied onto the substrate by a bubbling method, a vapor phase mass flow controller method, a direct gas injection (DGI) method, a direct liquid injection (DLI) method, a liquid transfer method in which the liquid is dissolved in an organic solvent and transferred, etc., the present disclosure is not limited thereto.

More specifically, the group 5 metal compound is mixed with a carrier gas or dilution gas containing one or more selected from the group consisting of argon (Ar), nitrogen (N$_2$), helium (He), and hydrogen (H$_2$) so that a mixture of the group 5 metal compound and the carrier gas or dilution gas is transferred onto the substrate by the bubbling method or the DGI method.

Meanwhile, the deposition process may include a step of supplying one or more reaction gases selected from the group consisting of water vapor (H$_2$O), oxygen (O$_2$), ozone (O$_3$), and hydrogen peroxide (H$_2$O$_2$) when forming a group 5 metal-containing thin film. In addition, the deposition process may include a step of supplying one or more reaction gases selected from the group consisting of ammonia (NH$_3$), hydrazine (N$_2$H$_4$), nitrous oxide (N$_2$O), and nitrogen (N$_2$) when forming a group 5 metal-containing thin film. Through this, a metal-containing thin film formed on the substrate may be a group 5 metal oxide film or a group 5 metal nitride film.

Hereinabove, the present disclosure has been described in detail through examples, but other types of examples that are different from them are also possible. Therefore, the technical spirit and scope of the claims set forth below are not limited to the examples.

What is claimed is:

1. A group 5 metal compound represented by the following <Chemical Formula

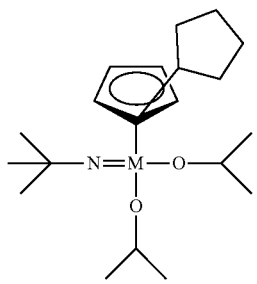

wherein M is any one selected from the group 5 metal elements.

2. A precursor composition for depositing a group 5 metal-containing thin film, the precursor composition comprising the group 5 metal compound represented by the following <Chemical Formula 1>:

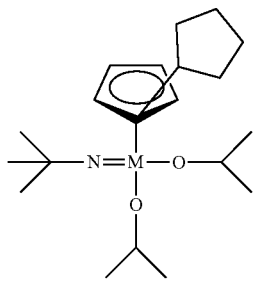

wherein M is any one selected from the group 5 metal elements.

* * * * *